United States Patent [19]
Chang et al.

[11] Patent Number: 5,578,527
[45] Date of Patent: Nov. 26, 1996

[54] CONNECTION CONSTRUCTION AND METHOD OF MANUFACTURING THE SAME

[75] Inventors: Shyh-Ming Chang, Hsinchu; Yu-Chi Lee, Taipei Hsien; Pao-Yun Tang, Hsinchu, all of Taiwan

[73] Assignee: Industrial Technology Research Institute, Hsinchu, Taiwan

[21] Appl. No.: 494,582

[22] Filed: Jun. 23, 1995

[51] Int. Cl.$^6$ .................................................... H01L 21/60
[52] U.S. Cl. ........................ 437/209; 437/183; 437/192; 437/211
[58] Field of Search ................................... 437/209, 211, 437/214, 180, 182, 183, 192, 193, 203

[56] References Cited

U.S. PATENT DOCUMENTS

| | | | |
|---|---|---|---|
| 4,731,282 | 3/1988 | Tsukagoshi et al. | 428/220 |
| 4,740,700 | 4/1988 | Shaham et al. | 437/180 |
| 4,963,002 | 10/1990 | Tagusa et al. | 350/336 |
| 5,120,678 | 6/1992 | Moore et al. | 437/211 |
| 5,244,833 | 9/1993 | Gansauge et al. | 437/183 |
| 5,334,804 | 8/1994 | Love et al. | 174/267 |
| 5,466,635 | 11/1995 | Lynch et al. | 437/183 |
| 5,478,779 | 12/1995 | Akram | 437/189 |

FOREIGN PATENT DOCUMENTS 0385787  1/1990  European Pat. Off. .

OTHER PUBLICATIONS

"Next Generation Liquid Crystal Display and High Density Package Technology", in Finetech Japan '94 Conf. Proceeding, Jul. 13, 1994.

"Interconnection Method of LCD LSIs by TAB–on–Glass and Board To Glass Using Aniostropic Conductive Film and Monosotropic Heat Seal Connections" presented at the 41st Electronic Components and Technology Conference.

IBM Technical Disclosure Bulletin vol. 18, No. 9, Feb. 1976, p. 2817.

*Primary Examiner*—Kevin Picardat
*Attorney, Agent, or Firm*—George O. Saile; Larry J. Prescott

[57] ABSTRACT

This invention provides a connection structure and methods of forming the connection structure which combines the advantages of composite bumps and conductive films formed of conductive particles in a non-conductive binder. The conductive film provides conductive particles in a non-conductive binder which can be placed on the input/output pads of an integrated circuit element or substrate. The conductive particles contact composite bumps comprised of a polymer body, having a relatively low Young's Modulus, and a conductive metal coating to form the connection structure. The relatively low Young's Modulus of the composite bumps greatly reduce the recoil forces during bonding. Because of the low recoil forces the connection can be formed with reduced bonding force and forces tending to separate the connection once formed are reduced. The non-conductive binder is cured to form the adhesive between the integrated circuit element and the substrate.

17 Claims, 3 Drawing Sheets

CONNECTION CONSTRUCTION AND METHOD OF MANUFACTURING THE SAME

RELATED PATENT APPLICATIONS (1) (E83-0002), Ser. No. 08/239,375, filed May 6, 1994, now abandoned entitled "COMPOSITE BUMP BONDING," assigned to the same assignee.

(2) (E83-0003), Ser. No. 08/239,424, filed May 6, 1994, now U.S. Pat. No. 5,393,697, entitled "COMPOSITE BUMP STRUCTURE AND METHODS OF FABRICATION, " assigned to the same assignee.

(3) (E83-0004), Ser. No. 08/239,380, filed May 6, 1994, now U.S. Pat. No. 5,431,328 entitled "COMPOSITE BUMP FLIP CHIP BONDING," assigned to the same assignee.

BACKGROUND OF THE INVENTION (1) Field of the Invention

The invention relates to the formation of a connection structure forming the physical and electrical connection between an integrated circuit element and a substrate. The connection structure is formed using composite bumps having a polymer body covered by a conductive metal coating and conductive particles suspended in a non-conductive binder.

(2) Description of the Related Art

The related Patent Applications, listed above, discuss composite bumps and bonded structures using composite bumps. U.S. Pat. No. 4,936,002 to Tagusa et al discusses bonding one or more conductive particles to a single connection. A Japanese article "Next Generation Liquid Crystal Display and High Density Package Technology," Finetech Japan '94 Conference Proceeding, Jul. 13, 1994 discusses the use of an anisotropic conductive film to form interconnections. U.S. Pat. No. 4,731,282 to Tsukagoshi et al discusses the use of an anisotropic conductive film.

This invention overcomes the disadvantage of other methods of using conductive films in forming interconnections by combining conductive films formed from conductive particles suspended in a non-conductive binder with the composite bump. The relatively low Young's Modulus of the composite bump allows the interconnections to be formed with substantially reduced recoil forces. These reduced recoil forces allow the interconnection to be formed with substantially reduced bonding forces and with less tendency to open the connection after it has been formed.

SUMMARY OF THE INVENTION

It is an object of this invention to provide a low cost and reliable connection structure between an integrated circuit element and substrate using composite bumps and conductive particles.

It is a further object of this invention to provide a method of forming a low cost and reliable connection structure between an integrated circuit element and substrate using composite bumps and conductive particles.

These objectives are achieved by combining composite bumps and a conductive film. The conductive film is made up of conductive particles having a spherical shape suspended in a non-conductive binder. The conductive film may be either isotropic, wherein the conductive particles can contact other conductive particles, or anisotropic, wherein the conductive particles are separated from each other by the non-conductive binder. The conductive particles can be a metal, graphite, or a composite. The composite conductive particle has a polymer body covered by a conductive metal coating. The composite bumps are comprised of a polymer body, having a low Young's Modulus covered by a conductive metal coating and are formed on either the integrated circuit element input/output pads, the substrate input/output pads or both. The relatively low Young's Modulus of the composite bump allows the interconnections to be formed with substantially reduced recoil forces.

In previous methods using anisotropic conductive films, shown in FIG. 1A and FIG. 1B, an anisotropic conductive film comprising metal conductive particles 22 in a non-conductive binder 20 was placed on the substrate 10 covering the substrate input/output pads 12. An integrated circuit element 30 having metal bumps formed on the integrated circuit element input/output pads 32 is brought together with the substrate so that the conductive particles of the anisotropic conductive film contact the metal bumps on the integrated circuit element and the corresponding input/output pads on the substrate. A disadvantage of this structure is that there are large recoil forces created by the rigid conductive particles of the anisotropic conductive film and the rigid metal bumps formed on the integrated circuit element which tend to separate the desired electrical contact.

In this invention the metal bumps on the integrated circuit element are replaced by composite bumps having a polymer body with a low Young's Modulus covered by a conductive metal coating. This low Young's Modulus makes the composite bump mechanically compliant and greatly reduces the recoil forces tending to separate the connection structure. In addition composite particles, having a polymer body with a low Young's Modulus covered by a conductive metal coating, can be used as the conductive particles in the conductive film which further reduces the recoil forces.

The non-conductive binder can be a thermoset material or a thermoplastic material and, when cured, provides the adhesive holding the integrated circuit element and substrate in place. Using thermoplastic material makes the problem of rework easier to handle. The non-conductive binder can be a flexible film or a viscous liquid to form a paste. Curing can be accomplished by thermal treatment of exposure to ultraviolet light.

The novel structure and method of this invention can be applied to a number of different bonding methods and arrangements for example TAB or Tape Automated Bonding, MCM or Multichip Module, COG or Chip on Glass, BGA or Ball Grid Array, and Flip Chip bonding.

DESCRIPTION OF THE PREFERRED EMBODIMENTS

Figure 1A:
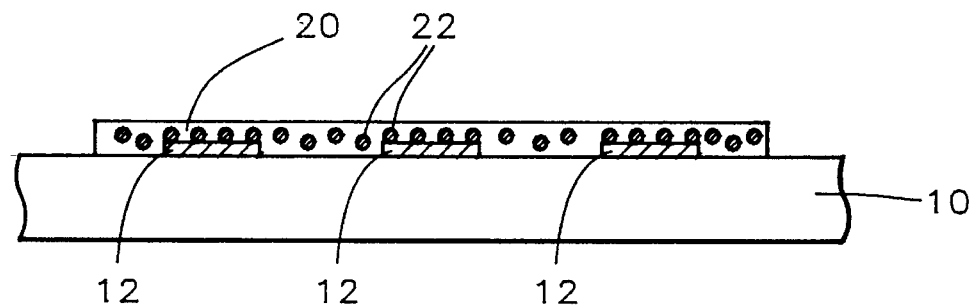
FIG. 1A shows a section view of an anisotropic conductive film formed on a substrate as described in prior art.
Figure 1B:
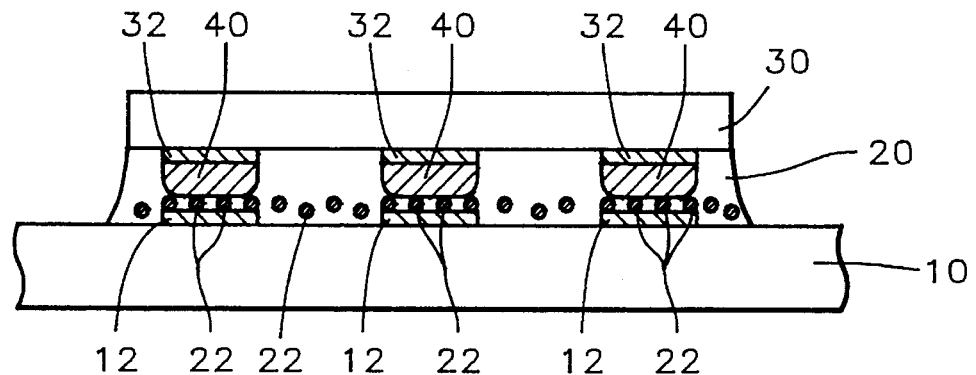
FIG. 1B shows a section view of an integrated circuit element joined to a substrate using an anisotropic conductive film as described in prior art.
Figure 2:
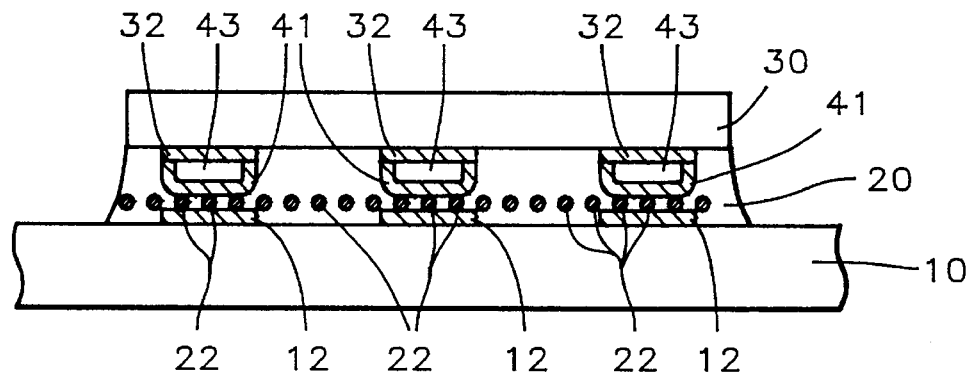
FIG. 2 shows a section view of an integrated circuit element joined to a substrate using composite bumps formed on the integrated circuit element and an anisotropic conductive film.

Refer now to FIG. 2, there is shown an embodiment of a method of forming the connection structure of this invention. Composite bumps are formed on the integrated circuit element 30 input/output pads 32. The composite bumps are comprised of a polymer body 43, such as polyamic acid polyimide, and a conductive metal coating 41 such as aluminum, gold/tungsten/titanium, gold/copper/chrome, gold/chrome, or the like.

The conductive film in this embodiment is an anisotropic conductive film. The anisotropic conductive film comprised of conductive particles 22 in a non-conductive binder 20 is placed on the surface of the substrate 10 covering the substrate input/output pads 12. The conductive particles 22 have a spherical shape having a diameter of between about 3 microns and 10 microns. The conductive particles are formed of a metal, such as nickel, solder, graphite, or a composite particle having a composition much like the composite bump. The composite particle has a polymer body, such as ABS or Acrylonitrile-Butadiene-Styrene plastic, a conductive metal coating, such as aluminum, gold/tungsten/titanium, gold/copper/chrome, gold/nickel, gold/chrome, or the like. The non-conductive binder can be a thermosetting material, such as epoxy, or can be a thermoplastic material, such as polyethylene. The non-conductive binder can also be a viscous liquid, such as epoxy-acrylic, so that the anisotropic conductive film is a paste. The conductive particles are held separate from each other by the non-conductive binder so that one conductive particle does not contact another.

The integrated circuit element 30 and the substrate 10 are brought together so that a number of conductive particles 22 of the anisotropic film are between the composite bump, 41 and 43, of the integrated circuit element and the corresponding input/output pad 12 of the substrate 10. The conductive particles 22 form the connection between the conductive metal coating 41 of the composite bump and the substrate input/output pad 12. The low Youngs Modulus of the polymer body 43 of the composite bump, about $0.4 \times 10^6$ to $0.5 \times 10^6$ psi, substantially reduces the recoil force after the connection structure has been formed. As shown in FIG. 2, there are conductive particles 22 between adjacent integrated circuit composite bumps, 41 and 43, and adjacent substrate input/output pads 12 but they are prevented from making unwanted electrical contact by the non-conductive binder 20.

The non-conductive binder 20 is then cured using ultra violet light curing or thermal curing. The non-conductive binder then forms an adhesive to hold the integrated circuit element 30 and the substrate 10 in place and the connection structure is completed.

Figure 5:
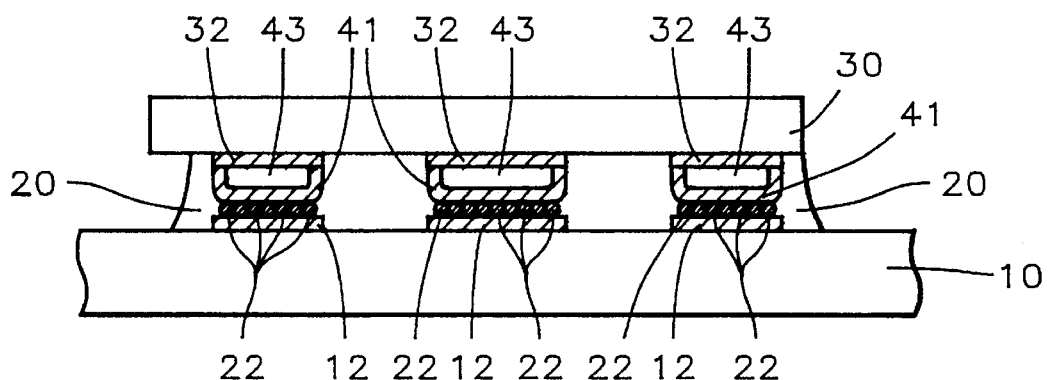
FIG. 5 shows a section view of an integrated circuit element joined to a substrate using composite bumps formed on the integrated circuit element and electrically conductive particles.

Another embodiment of a method of forming the connection structure is shown in FIG. 5. As in the previous embodiment the composite bumps, 41 and 43, are formed on the integrated circuit element 30 input/output pads 32. The method of this embodiment proceeds like the method of the previous embodiment except that the conductive particles 22 are placed only over the substrate 10 input/output pads 12 and not in the area between adjacent substrate input/output pads 12. In this embodiment the conductive particles 22 placed over the substrate 10 input/output pads 12 are placed close together and can contact each other.

Figure 3:
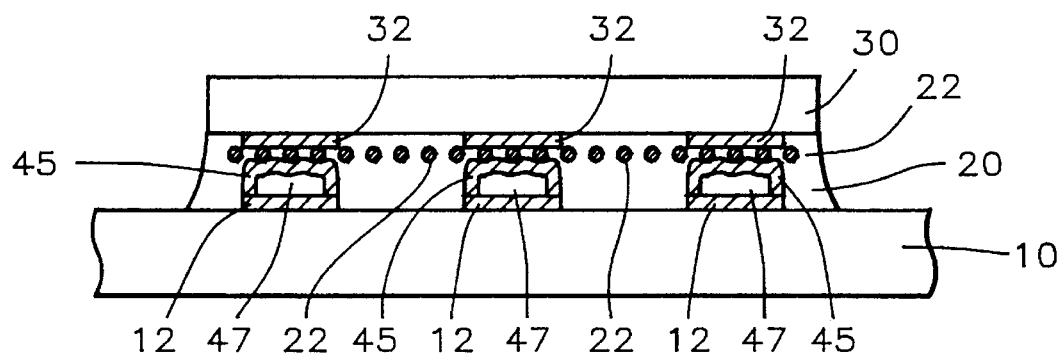
FIG. 3 shows a section view of an integrated circuit element joined to a substrate using composite bumps formed on the substrate and an anisotropic conductive film.

Refer now to FIG. 3, there is shown another embodiment of a method of forming the connection structure of this invention. Composite bumps are formed on the substrate 10 input/output pads 12. The composite bumps are comprised of a polymer body 47, such as polyamic acid polyimide, and a conductive metal coating 45 such as aluminum, gold/tungsten/titanium, gold/copper/chrome, gold/chrome, or the like.

In this embodiment the conductive film is an anisotropic conductive film. The anisotropic conductive film comprised of conductive particles 22 in a non-conductive binder 20 is placed on the surface of the integrated circuit element 30 covering the integrated circuit element input/output pads 32. The conductive particles 22 have a spherical shape having a diameter of between about 3 microns and 10 microns. The conductive particles are formed of a metal, such as nickel, solder, graphite, or a composite particle having a composition much like the composite bump. The composite particle has a polymer body, such as ABS or Acrylonitrile-Butadiene-Styrene plastic, and a conductive metal coating, such as aluminum, gold/tungsten/titanium, gold/copper/chrome, gold/nickel, gold/chrome, or the like. The non-conductive binder can be a thermosetting material such as epoxy or can be a thermoplastic material. The non-conductive binder can be a plastic type material so that the anisotropic conductive film is a film type material. The non-conductive binder can also be a viscous liquid so that the anisotropic conductive film is a paste. The conductive particles are held separate from each other by the non-conductive binder so that one conductive particle does not contact another.

The integrated circuit element 30 and the substrate 10 are brought together so that a number of conductive particles 22 of the anisotropic conductive film are between the composite bump, 45 and 47, on the substrate and the corresponding input/output pad 32 of the integrated circuit element 30. The conductive particles 22 form the connection between the conductive metal coating 41 of the composite bump and the integrated circuit element input/output pad 32. The low Youngs Modulus of the polymer body 47 of the composite bump, about $0.4 \times 106$ to $0.5 \times 106$ psi, substantially reduces the recoil force after the connection structure has been formed. As shown in FIG. 3, there are conductive particles 22 between adjacent substrate composite bumps, 41 and 43, and adjacent integrated circuit element input/output pads 32 but they are prevented from making unwanted electrical contact by the non-conductive binder 20.

The non-conductive binder 20 is then cured using ultra violet light curing or thermal curing. The non-conductive binder then forms an adhesive to hold the integrated circuit element 30 and the substrate 10 in place and the connection structure is completed.

Figure 6:
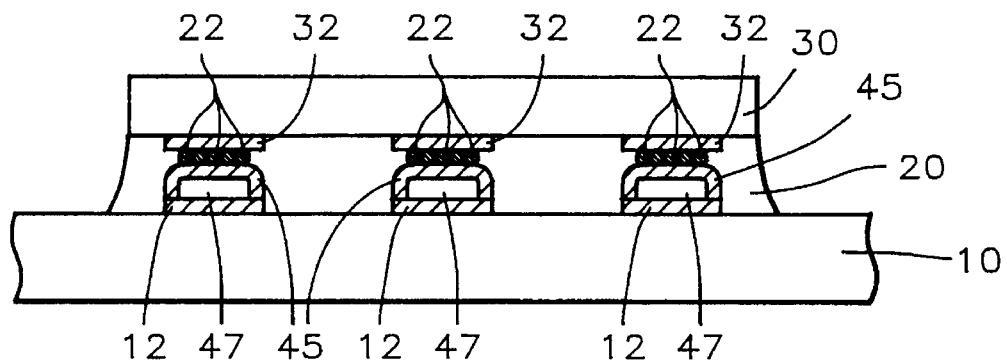
FIG. 6 shows a section view of an integrated circuit element joined to a substrate using composite bumps formed on the substrate and electrically conductive particles.

Another embodiment of a method of forming the connection structure is shown in FIG. 6. As in the previous embodiment the composite bumps, 45 and 47, are formed on the substrate 10 input/output pads 12. The method of this embodiment proceeds like the method of the previous embodiment except that the conductive particles 22 are placed only over the integrated circuit element 30 input/output pads 32 and not in the area between adjacent integrated circuit element input/output pads 32. In this embodiment the conductive particles 22 placed over the integrated circuit element 30 input/output pads 32 are placed close together and can contact each other.

Figure 4:
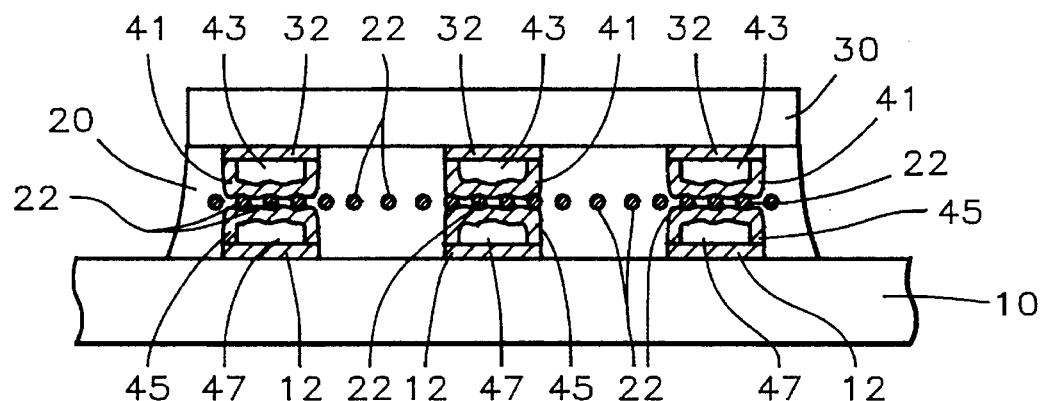
FIG. 4 shows a section view of an integrated circuit element joined to a substrate using composite bumps formed on both the integrated circuit element and the substrate and an anisotropic conductive film.

Refer now to FIG. 4, there is shown another embodiment of a method of forming the connection structure of this invention. Composite bumps are formed on the both the integrated circuit element 30 input/output pads 32 and the substrate 10 input/output pads 12. The composite bumps are comprised of a polymer body, 43 and 47, such as polyamic acid polyimide, and a conductive metal coating, 41 and 45, such as aluminum, gold/tungsten/titanium, gold/copper/chrome, gold/chrome, or the like.

An anisotropic conductive film comprised of conductive particles 22 in a non-conductive binder 20 is placed either on the surface of the substrate 10 covering the composite bumps, 45 and 47, formed on the substrate input/output pads 12 or on the surface of the integrated circuit element 30 covering the composite bumps, 41 and 43, formed on the integrated circuit element input/output pads 32. The conductive particles 22 have a spherical shape having a diameter of between about 8 microns and 10 microns. The conductive particles are formed of a metal, such as nickel, solder, graphite, or a composite particle having a composition much like the composite bump. The composite particle has a polymer body, such as ABS or Acrylonitrile-Butadiene-Styrene plastic, and a conductive metal coating, such as aluminum, gold/tungsten/titanium, gold/copper/chrome, gold/nickel, gold/chrome, or the like. The non-conductive binder can be a thermosetting material, such as epoxy, or can be a thermoplastic material, such as polyethylene. The non-conductive binder can also be a viscous liquid, such as Epoxy-Acrylic, so that the anisotropic conductive film is a paste. The conductive particles are held separate from each other by the non-conductive binder so that one conductive particle does not contact another.

The integrated circuit element 30 and the substrate 10 are brought together so that a number of conductive particles 22 of the anisotropic film are between the composite bumps, 41 and 43, on the integrated circuit element and the corresponding composite bumps, 45 and 47, on the substrate. The conductive particles 22 form the connection between the conductive metal coating 41 of the integrated circuit element composite bumps and the conductive metal coating 45 of the substrate composite bumps. The low Youngs Modulus of the polymer body, 43 and 47, of the composite bumps, about $0.4 \times 10^6$ to $0.5 \times 10^6$ psi, substantially reduces the recoil force after the connection structure has been formed. As shown in FIG. 4, there are conductive particles 22 between adjacent integrated circuit element composite bumps, 41 and 43, and adjacent substrate composite bumps, 45 and 47, but they are prevented from making unwanted electrical contact by the non-conductive binder 20.

The non-conductive binder 20 is then cured using ultra violet light curing or thermal curing. The non-conductive binder then forms an adhesive to hold the integrated circuit element 30 and the substrate 10 in place and the connection structure is completed.

Figure 7:
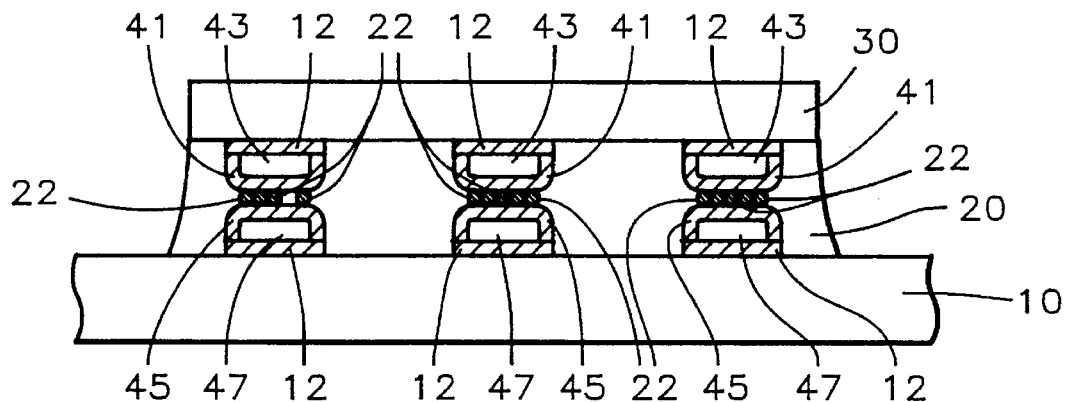
FIG. 7 shows a section view of an integrated circuit element joined to a substrate using composite bumps formed on both the integrated circuit element and the substrate and electrically conductive particles.

Another embodiment of a method of forming the connection structure is shown in FIG. 7. As in the previous embodiment composite bumps are formed on the integrated circuit element 30 input/output pads 32 and on the substrate 10 input/output pads 12. The method of this embodiment proceeds like the method of the previous embodiment except that the conductive particles 22 are placed only over the substrate composite bumps, 45 and 47, or over the integrated circuit element composite bumps, 41 and 43, and are not placed between adjacent substrate composite bumps or integrated circuit element composite bumps. In this embodiment the conductive particles 22 placed over the substrate composite bumps, 45 and 47, or over the integrated circuit element composite bumps, 41 and 43, are placed close together and can contact each other.

Figure 8:
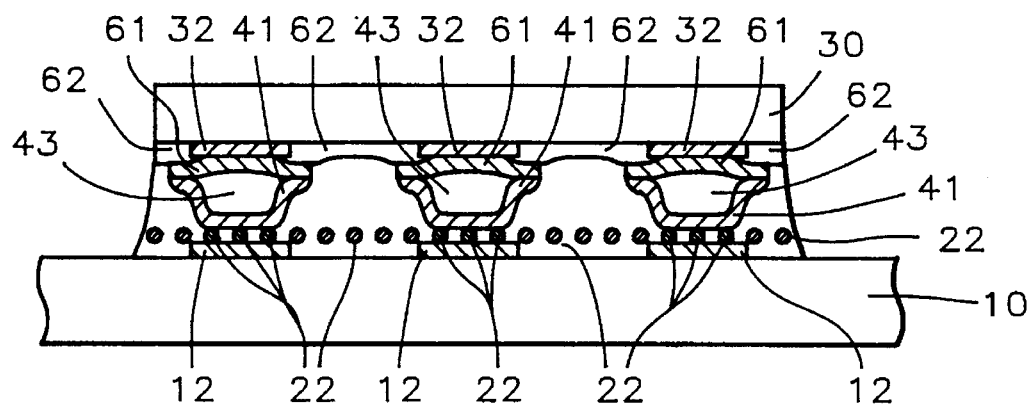
FIG. 8 shows a section view of an integrated circuit element with a passivation layer joined to a substrate using composite bumps formed on the integrated circuit element and an anisotropic conductive film.

Refer now to FIG. 8, there is shown another embodiment of a method of forming the connection structure of this invention. In this embodiment input/output pads 32 are formed on the integrated circuit element 30. A passivation layer 62, such as $SiO_2$ for example, is formed on the integrated circuit element 30 with openings for the input/output pads 32. A base metal pad 61, formed of a metal such as aluminum for example, is then formed over the openings in the passivation layer making contact with the input/output pads 32.

Composite bumps are formed on the base metal pads 61. The composite bumps are comprised of a polymer body 43, such as polyamic acid polyimide, and a conductive metal coating 41 such as aluminum, gold/tungsten/titanium, gold/copper/chrome, gold/chrome, or the like.

The conductive film in this embodiment is an anisotropic conductive film. The anisotropic conductive film comprised of conductive particles 22 in a non-conductive binder 20 is placed on the surface of the substrate 10 covering the substrate input/output pads 12. The conductive particles 22 have a spherical shape having a diameter of between about 3 microns and 10 microns. The conductive particles are formed of a metal, such as nickel, solder, graphite, or a composite particle having a composition much like the composite bump. The composite particle has a polymer body, such as ABS or Acrylonitrile-Butadiene-Styrene plastic, a conductive metal coating, such as aluminum, gold/tungsten/titanium, gold/copper/chrome, gold/nickel, gold/chrome, or the like. The non-conductive binder can be a thermosetting material, such as epoxy, or can be a thermoplastic material, such as polyethylene. The non-conductive binder can also be a viscous liquid, such as epoxy-acrylic, so that the anisotropic conductive film is a paste. The conductive particles are held separate from each other by the non-conductive binder so that one conductive particle does not contact another.

The integrated circuit element 30 and the substrate 10 are brought together so that a number of conductive particles 22 of the anisotropic film are between the composite bump, 41 and 43, of the integrated circuit element and the corresponding input/output pad 12 of the substrate 10. The conductive particles 22 form the connection between the conductive metal coating 41 of the composite bump and the substrate input/output pad 12. The low Youngs Modulus of the polymer body 43 of the composite bump, about $0.4 \times 10^6$ to $0.5 \times 10^6$ psi, substantially reduces the recoil force after the connection structure has been formed. As shown in FIG. 2, there are conductive particles 22 between adjacent integrated circuit composite bumps, 41 and 43, and adjacent substrate input/output pads 12 but they are prevented from making unwanted electrical contact by the non-conductive binder 20.

The non-conductive binder 20 is then cured using ultra violet light curing or thermal curing. The non-conductive binder then forms an adhesive to hold the integrated circuit element 30 and the substrate 10 in place, the conductive film becomes an adhesive film, and the connection structure is completed.

Refer now to FIG. 2, there is shown an embodiment of the connection structure of this invention. Composite bumps are formed on the integrated circuit element 30 input/output pads 32. The composite bumps are as described in the previous embodiments. Conductive particles 22 in a non-conductive binder 20 are placed between the composite bumps formed on the integrated circuit element input/output pads and the corresponding substrate input/output pads 12. The conductive particles 22 are as described in previous embodiments. The non-conductive binder can be a thermosetting material, such as epoxy, or can be a thermoplastic material, such as polyethylene. The non-conductive binder can also be a viscous liquid, such as Epoxy-Acrylic, so that the anisotropic conductive film is a paste. The conductive particles are held separate from each other by the non-conductive binder so that one conductive particle does not contact another.

The conductive particles 22 form the connection between the conductive metal coating 41 of the composite bump and the substrate input/output pad 12. The low Youngs Modulus of the polymer body 43 of the composite bump, about $0.4 \times 10^6$ to $0.5 \times 10^6$ psi, substantially reduces the recoil force after the connection structure has been formed. As shown in FIG. 2, there are conductive particles 22 between adjacent integrated circuit composite bumps, 41 and 43, and adjacent substrate input/output pads 12 but they are prevented from making unwanted electrical contact by the non-conductive binder 20. The cured non-conductive binder forms an adhesive to hold the integrated circuit element 30 and the substrate 10 in place and the connection structure is completed.

Another embodiment of the connection structure of this invention shown in FIG. 5. This embodiment is the same as the previous embodiment except that the conductive particles 22 are placed only over the substrate 10 input/output pads 12 and not in the area between adjacent substrate input/out pads 12. In this embodiment the conductive particles 22 placed over the substrate 10 input/output pads 12 are close together and can contact each other.

Refer now to FIG. 3, there is shown an embodiment of the connection structure of this invention. Composite bumps are formed on the substrate 10 input/output pads 12. The composite bumps are as described in the previous embodiments. Conductive particles 22 in a non-conductive binder 20 are placed between the composite bumps formed on the substrate input/output pads and the corresponding integrated circuit element input/output pads 32. The conductive particles 22 are as described in previous embodiments. The non-conductive binder can be a thermosetting material, such as epoxy, or can be a thermoplastic material, such as polyethylene. The non-conductive binder can also be a viscous liquid so that the anisotropic conductive film is a paste. The conductive particles are held separate from each other by the non-conductive binder so that one conductive particle does not contact another.

The conductive particles 22 form the connection between the conductive metal coating 45 of the composite bumps and the integrated circuit element input/output pads 32. The low Youngs Modulus of the polymer body 47 of the composite bumps, about $0.4 \times 10^6$ to $0.5 \times 10^6$ psi, substantially reduces the recoil force after the connection structure has been formed. As shown in FIG. 3, there are conductive particles 22 between adjacent substrate composite bumps, 45 and 47, and adjacent integrated circuit element input/output pads 32 but they are prevented from making unwanted electrical contact by the non-conductive binder 20. The cured non-conductive binder forms an adhesive to hold the integrated circuit element 30 and the substrate 10 in place and the connection structure is completed.

Another embodiment of the connection structure of this invention shown in FIG. 6. This embodiment is the same as the previous embodiment except that the conductive particles 22 placed only over the integrated circuit element 30 input/output pads 32 and not in the area between adjacent integrated circuit element input/out pads 32. In this embodiment the conductive particles 22 placed over the integrated circuit element 30 input/output pads 32 are placed close together and can contact each other.

Refer now to FIG. 4, there is shown an embodiment of the connection structure of this invention. Composite bumps are formed on both the integrated circuit element 30 input/output pads 32 and the substrate 10 input/output pads 12. The composite bumps are as described in the previous embodiments. Conductive particles 22 in a non-conductive binder 20 are placed between the composite bumps formed on the integrated circuit element input/output pads and the corresponding composite bumps formed on the substrate input/output pads 12. The conductive particles 22 are as described in previous embodiments. The non-conductive binder can be a thermosetting material, such as epoxy, or can be a thermoplastic material, such as polyethylene. The non-conductive binder can also be a viscous liquid so that the anisotropic conductive film is a paste. The conductive particles are held separate from each other by the non-conductive binder so that one conductive particle does not contact another.

The conductive particles 22 form the connection between the conductive metal coating 41 of the integrated circuit element composite bumps and the conductive metal coating 45 of the substrate composite bumps. The low Youngs Modulus of the composite bumps, about $0.4 \times 10^6$ to $0.5 \times 10^6$ psi, substantially reduces the recoil force after the connection structure has been formed. As shown in FIG. 4, there are conductive particles 22 between adjacent integrated circuit composite bumps, 41 and 43, and adjacent substrate composite bumps, 45 and 47, but they are prevented from making unwanted electrical contact by the non-conductive binder 20. The cured non-conductive binder forms an adhesive to hold the integrated circuit element 30 and the substrate 10 in place and the connection structure is completed.

Another embodiment of the connection structure of this invention shown in FIG. 7. This embodiment is the same as the previous embodiment except that the conductive particles 22 are placed only between the substrate 10 composite bumps and the corresponding integrated circuit element 30 composite bumps and not between adjacent substrate composite bumps or between adjacent integrated circuit element composite bumps. In this embodiment the conductive particles 22 placed between the substrate 10 composite bumps and the corresponding integrated circuit element 30 composite bumps are placed close together and can contact each other.

Refer now to FIG. 8, there is shown another embodiment of the connection structure of this invention. Input/output pads 32 are formed on the integrated circuit element 30. A passivation layer 62, such as $SiO_2$ for example, is formed on the integrated circuit element 30 with openings for the input/output pads 32. Base metal pads 61, of a metal such as aluminum for example, are formed over the openings in the passivation layer making contact with the input/output pads 32.

Composite bumps are formed on the base metal pads 61. The composite bumps are as described in the previous embodiments. Conductive particles 22 in a non-conductive binder 20 are placed between the composite bumps formed on the integrated circuit element input/output pads and the corresponding substrate input/output pads 12. The conductive particles 22 are as described in previous embodiments. The non-conductive binder can be a thermosetting material., such as epoxy, or can be a thermoplastic material, such as polyethylene. The non-conductive binder can also be a viscous liquid, such as Epoxy-Acrylic, so that the anisotropic conductive film is a paste. The conductive particles are held separate from each other by the non-conductive binder so that one conductive particle does not contact another.

The conductive particles 22 form the connection between the conductive metal coating 41 of the composite bump and the substrate input/output pad 12. The low Youngs Modulus of the polymer body 43 of the composite bump, about $0.4 \times 10^6$ to $0.5 \times 10^6$ psi, substantially reduces the recoil force after the connection structure has been formed. As shown in FIG. 2, there are conductive particles 22 between adjacent integrated circuit composite bumps, 41 and 43, and adjacent substrate input/output pads 12 but they are prevented from making unwanted electrical contact by the non-conductive binder 20. The cured non-conductive binder forms an adhesive to hold the integrated circuit element 30 and the substrate 10 in place, the conductive film becomes and adhesive film, and the connection structure is completed.

While the invention has been particularly shown and described with reference to the preferred embodiments thereof, it will be understood by those skilled in the art that various changes in form and details may be made without departing from the spirit and scope of the invention.

What is claimed is:

1. A method of forming a bonded structure, comprising:
   providing an integrated circuit element having input/output pads;
   providing a substrate having input/output pads;
   providing composite bumps comprised of a polymer body and a conductive metal coating covering said polymer body wherein each said polymer body of each said composite bump is completely surrounded either by said conductive metal coating of said composite bump and one of said integrated circuit element input/output pads or by said conductive metal coating of said composite bump and one of said substrate input/output pads;
   providing a conductive adhesive comprised of a plurality of conductive particles in a non-conductive binder; and
   bringing together said integrated circuit element and said substrate to form a plurality of physical and electrical connections between said integrated circuit element input/output pads and said substrate input/output pads wherein each said connection includes a number of said conductive particles and one or two of said composite bumps.

2. The method of claim 1, wherein said composite bumps are formed on said integrated circuit element input/output pads prior to forming said physical and electrical connections and said conductive particles are between said substrate input/output pads and said composite bumps.

3. The method of claim 1, wherein said composite bumps are formed on said substrate input/output pads prior to forming said physical and electrical connections and said conductive particles are between said integrated circuit element input/output pads and said composite bumps.

4. The method of claim 1, wherein said composite bumps are formed on said integrated circuit element input/output pads and said substrate input/output pads prior to forming said physical and electrical connections and said conductive particles are between said composite bumps formed on said integrated circuit element input/output pads and said composite bumps formed on said substrate input/output pads.

5. The method of claim 1 wherein said conductive particles are metal.

6. The method of claim 1 wherein said conductive particles are graphite.

7. The method of claim 1 wherein said conductive particles are composite particles having a polymer body and a conductive metal coating covering said polymer body.

8. The method of claim 1 wherein said non-conductive binder is thermosetting material.

9. The method of claim 1 wherein said non-conductive binder is a thermoplastic material.

10. The method of claim 1 wherein said conductive particles are separated from other said conductive particles by said non-conductive binder.

11. The method of claim 1 wherein some of said conductive particles contact other said conductive particles.

12. The method of claim 1 wherein said physical and electrical connections are formed using thermal curing of said non-conductive binder.

13. The method of claim 1 wherein said physical and electrical connections are formed using ultra-violet light curing of said non-conductive binder.

14. The method of claim 11 wherein said conductive adhesive is an anisotropic conductive film.

15. The method of claim 1 wherein said conductive adhesive is an anisotropic conductive paste.

16. A method of forming a bonded structure, comprising:
    providing an integrated circuit element having input/output pads;
    providing base metal pads formed on said integrated circuit element wherein each said base metal pad has electrical contact with one of said integrated circuit element input/output pads;
    providing a substrate having input/output pads;
    providing composite bumps comprised of a polymer body and a conductive metal coating covering said polymer body formed on said integrated circuit element wherein each said polymer body of each said composite bump is completely surrounded by said conductive metal coating of said composite bump and one of said base metal pads;
    providing a conductive adhesive comprised of a plurality of conductive particles in a non-conductive binder; and
    bringing together said integrated circuit element and said substrate to form a plurality of physical and electrical connections between said integrated circuit element input/output pads and said substrate input/output pads wherein each said connection includes a number of said conductive particles and one or two said composite bumps.

17. The method of claim 16 wherein said conductive particles are composite particles having a polymer body and a conductive metal coating covering said polymer body.

* * * * *